(12) United States Patent
Calabrese et al.

(10) Patent No.: US 11,694,932 B2
(45) Date of Patent: Jul. 4, 2023

(54) ARRAY OF VERTICAL TRANSISTORS, AN ARRAY OF MEMORY CELLS COMPRISING AN ARRAY OF VERTICAL TRANSISTORS, AND A METHOD USED IN FORMING AN ARRAY OF VERTICAL TRANSISTORS

(71) Applicant: Micron Technology, Inc., Boise, ID (US)

(72) Inventors: Marcello Calabrese, Monza (IT); Antonino Rigano, Cernusco sul Naviglio (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/745,338

(22) Filed: May 16, 2022

(65) Prior Publication Data
US 2022/0278001 A1    Sep. 1, 2022

Related U.S. Application Data

(63) Continuation of application No. 17/023,142, filed on Sep. 16, 2020, now Pat. No. 11,373,914.
(Continued)

(51) Int. Cl.
*H01L 21/8234* (2006.01)
*H01L 29/66* (2006.01)
(Continued)

(52) U.S. Cl.
CPC .............. *H01L 21/823487* (2013.01); *H01L 21/02236* (2013.01); *H01L 21/823418* (2013.01);
(Continued)

(58) Field of Classification Search
CPC ....... H01L 21/823487; H01L 29/66666; H01L 21/823462; H01L 21/823475;
(Continued)

(56) References Cited

U.S. PATENT DOCUMENTS 9,230,985 B1 * 1/2016 Wu ................... H01L 29/78618
9,368,572 B1    6/2016 Cheng et al.
(Continued)

FOREIGN PATENT DOCUMENTS

KR    10-2012-0139067    12/2012
WO   PCT/US2021/044622   12/2021

*Primary Examiner* — David Vu
(74) *Attorney, Agent, or Firm* — Wells St. John P.S.

(57) ABSTRACT

A method used in forming an array of vertical transistors comprises forming laterally-spaced vertical projections that project upwardly from a substrate in a vertical cross-section. The vertical projections individually comprise an upper source/drain region, a lower source/drain region, and a channel region vertically there-between. First gate insulator material is formed along opposing sidewalls of the channel region in the vertical cross-section. One of (a) or (b) is formed over opposing sidewalls of the first gate insulator material in the vertical cross-section, where (a): conductive gate lines that are horizontally elongated through the vertical cross-section; and (b): sacrificial placeholder gate lines that are horizontally elongated through the vertical cross-section. The one of the (a) or the (b) laterally overlaps the upper source/drain region and the lower source/drain region. The first gate insulator material has a top that is below a top of the channel region and has a bottom that is above a bottom of the channel region. An upper void space is laterally between the one of the (a) or the (b) and both of the upper source/drain region and the channel region. A lower void space is laterally between the one of the (a) or the (b) and both of the lower source/drain region and the channel region. Second gate insulator material is formed in the upper and
(Continued)

lower void spaces. Other embodiments, including structure independent of method, are disclosed.

27 Claims, 10 Drawing Sheets

Related U.S. Application Data

(60) Provisional application No. 63/071,141, filed on Aug. 27, 2020.

(51) Int. Cl.
*H01L 21/28* (2006.01)
*H01L 29/78* (2006.01)
*H01L 21/02* (2006.01)
*H10B 51/30* (2023.01)

(52) U.S. Cl.
CPC ........ *H01L 21/823462* (2013.01); *H01L 21/823475* (2013.01); *H01L 29/40111* (2019.08); *H01L 29/6684* (2013.01); *H01L 29/66666* (2013.01); *H01L 29/7827* (2013.01); *H01L 29/78391* (2014.09); *H10B 51/30* (2023.02)

(58) Field of Classification Search
CPC ............. H01L 29/6684; H01L 27/1159; H01L 21/02236; H01L 29/7827; H01L 21/823418; H01L 29/40111; H01L 29/78391

See application file for complete search history.

(56) References Cited

U.S. PATENT DOCUMENTS

| | | |
|---|---|---|
| 9,559,201 B2 | 1/2017 | Surthi |
| 9,871,117 B2 | 1/2018 | Doyle et al. |
| 2012/0319201 A1 | 12/2012 | Sun et al. |
| 2020/0111796 A1 | 4/2020 | Nourbakhsh et al. |
| 2020/0111907 A1 | 4/2020 | Karda et al. |
| 2021/0193527 A1 | 6/2021 | Reznicek et al. |

* cited by examiner

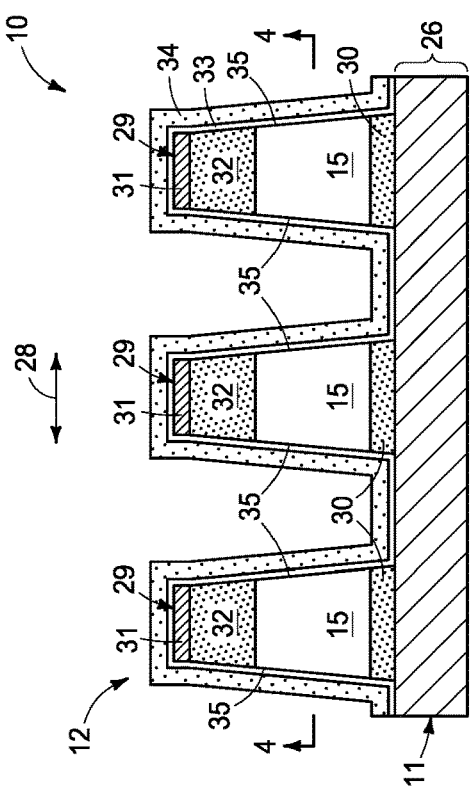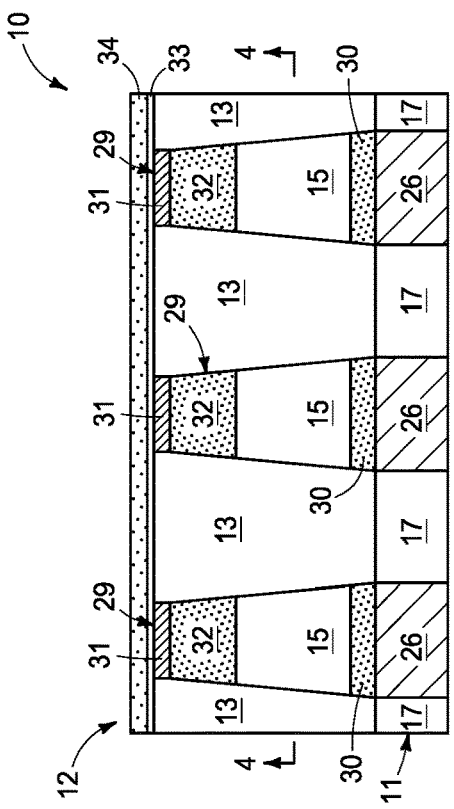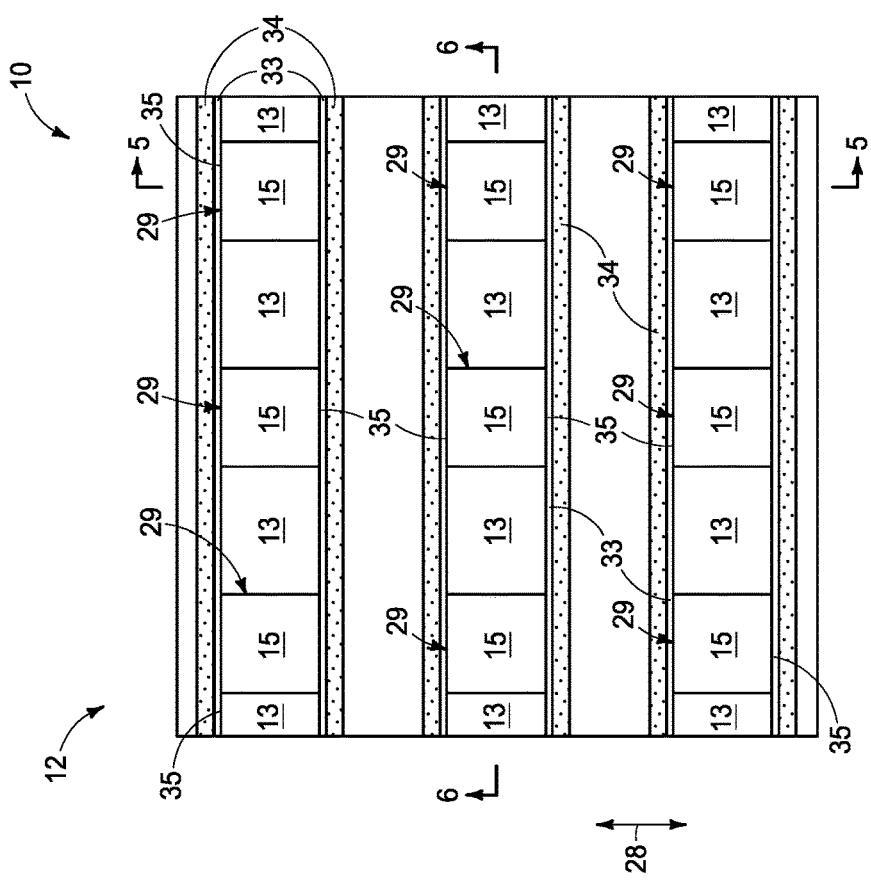

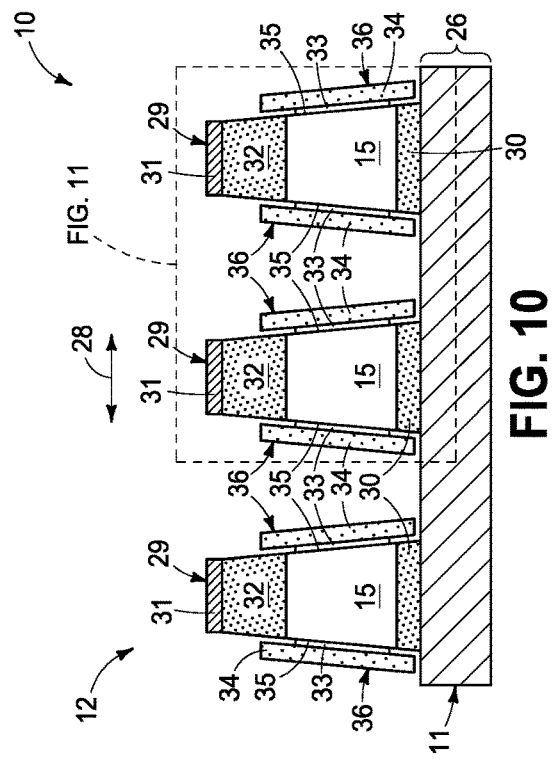
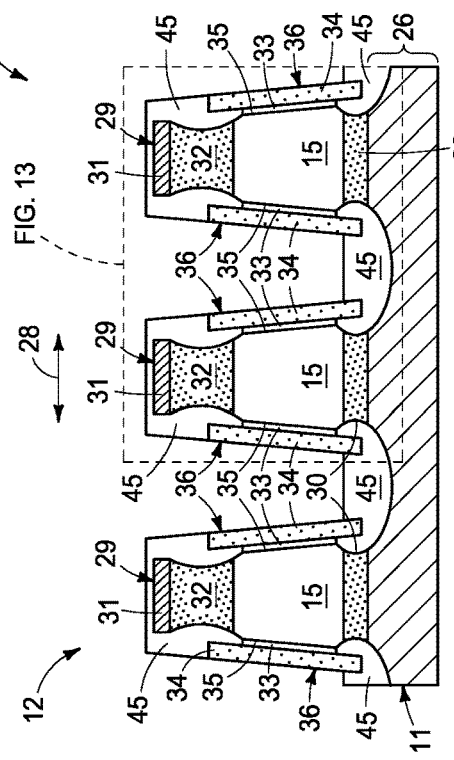
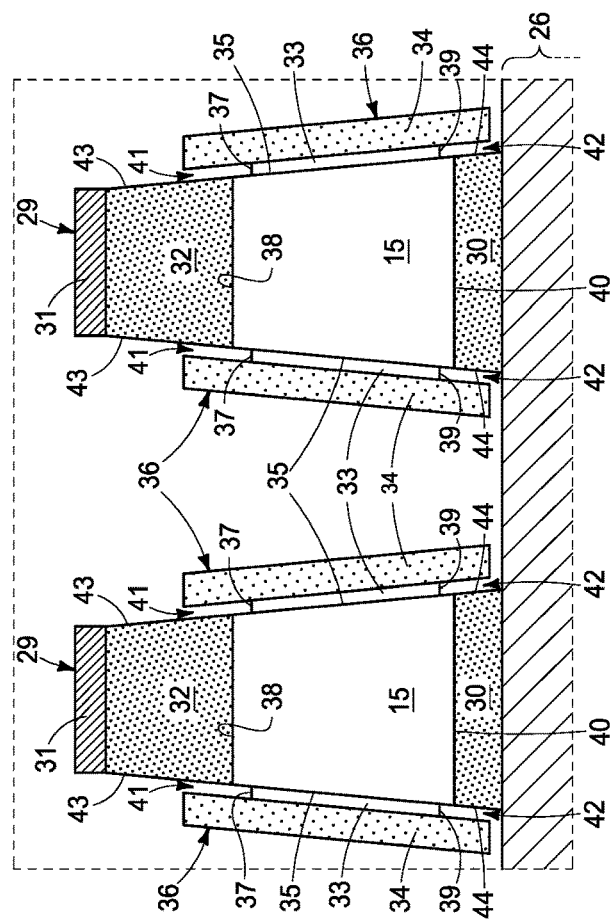
FIG. 10
FIG. 12
FIG. 11

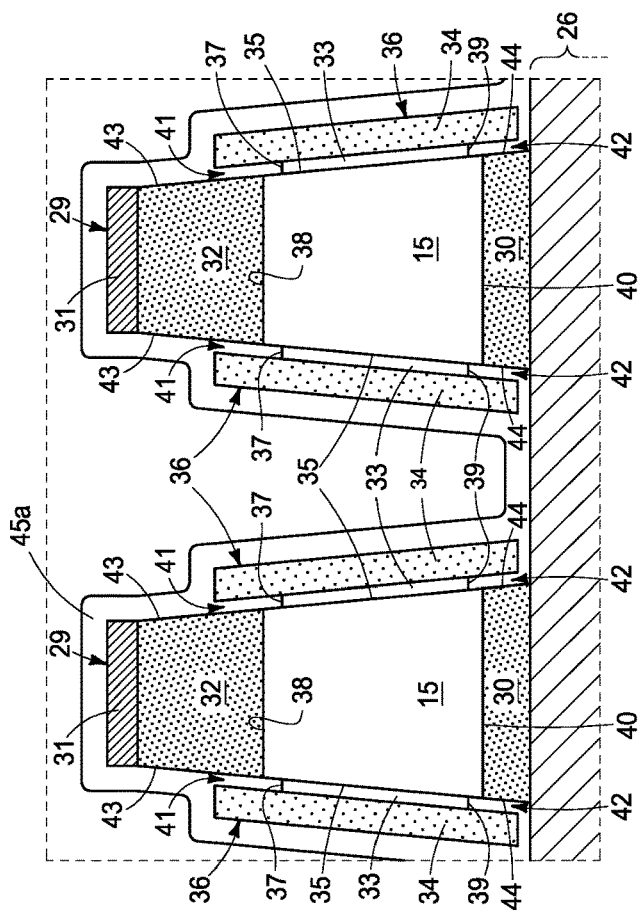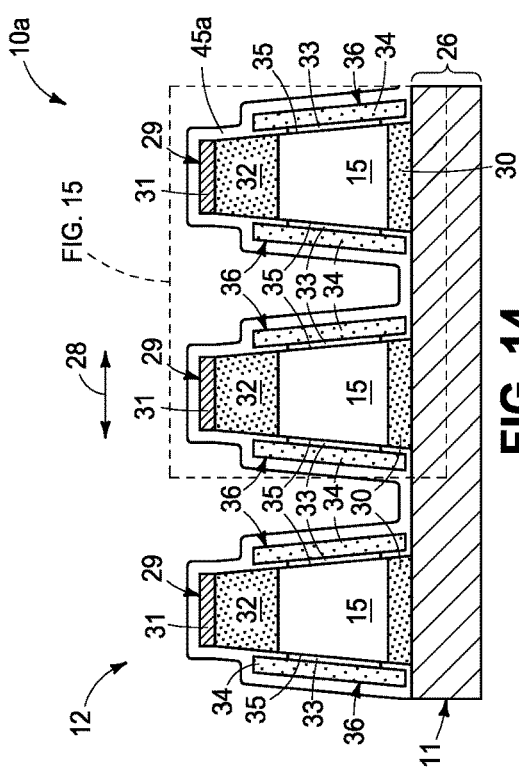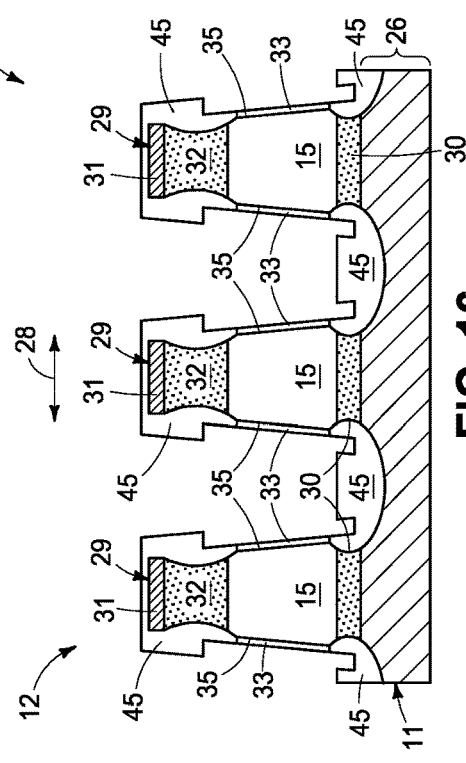

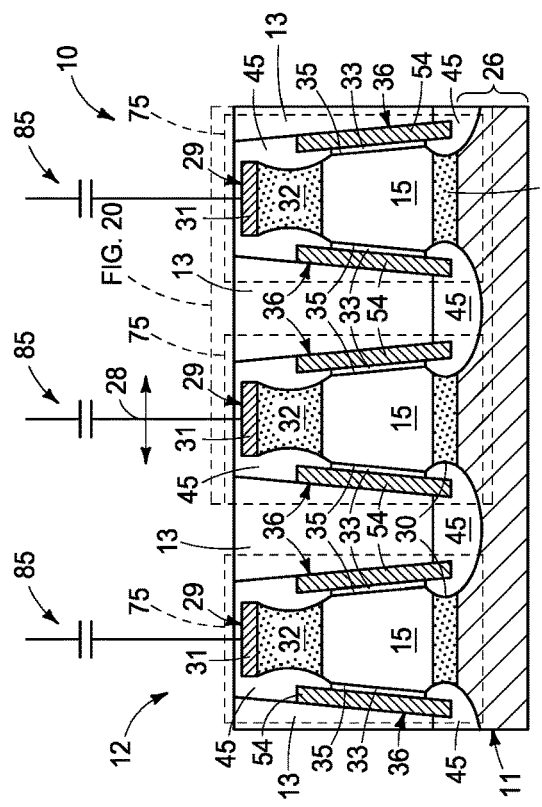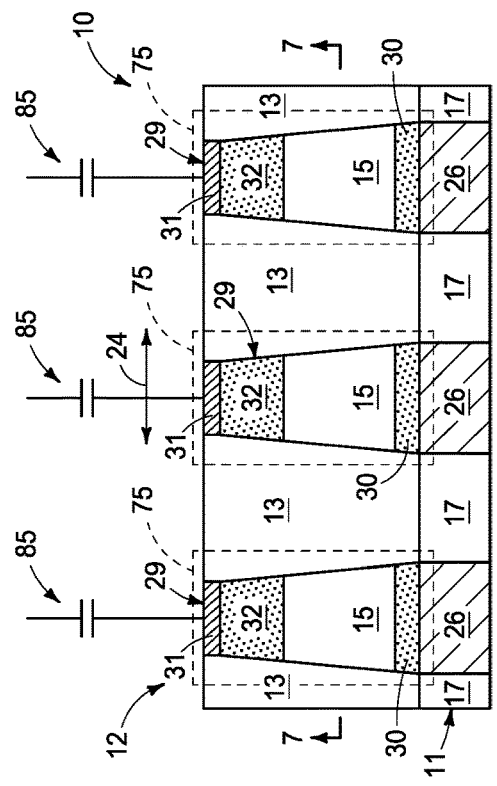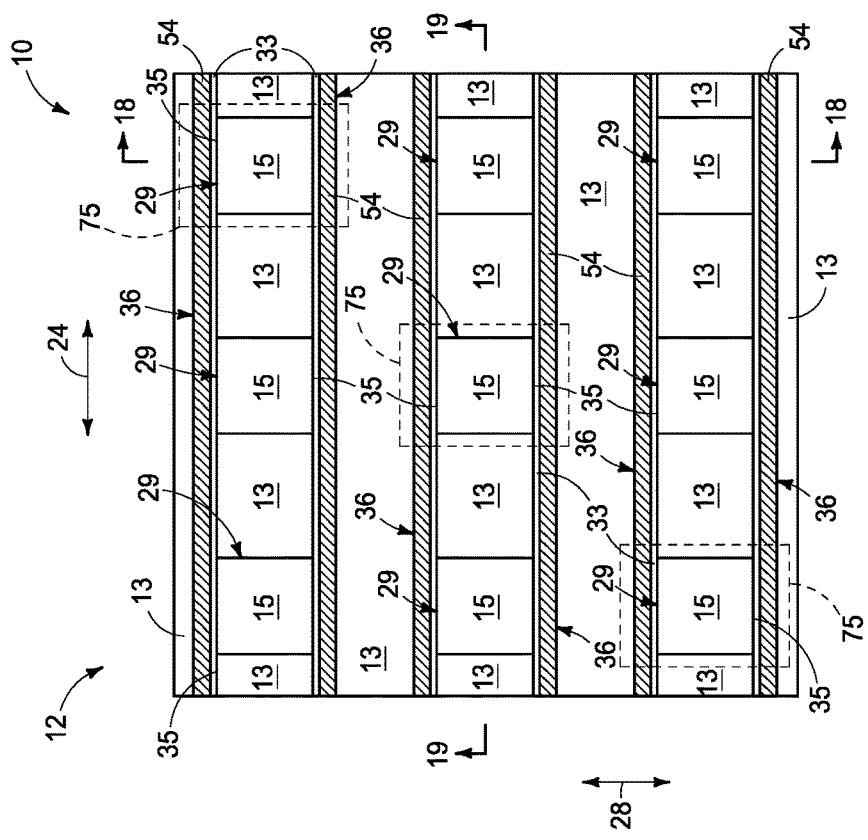

ARRAY OF VERTICAL TRANSISTORS, AN ARRAY OF MEMORY CELLS COMPRISING AN ARRAY OF VERTICAL TRANSISTORS, AND A METHOD USED IN FORMING AN ARRAY OF VERTICAL TRANSISTORS

RELATED PATENT DATA

This patent resulted from a continuation application of U.S. patent application Ser. No. 17/023,142, filed Sep. 16, 2020, entitled "An Array Of Vertical Transistors, An Array Of Memory Cells Comprising An Array Of Vertical Transistors, And A Method Used In Forming An Array Of Vertical Transistors", naming Marcello Calabrese, Antonino Rigano, and Marcello Mariani as inventors, which claims priority to U.S. Provisional Patent Application Ser. No. 63/071,141, filed Aug. 27, 2020, entitled "An Array Of Vertical Transistors, An Array Of Memory Cells Comprising An Array Of Vertical Transistors, And A Method Used In Forming An Array Of Vertical Transistors", naming Marcello Calabrese, Antonino Rigano, and Marcello Mariani as inventors, the disclosures of which are incorporated by reference.

TECHNICAL FIELD

Embodiments disclosed herein pertain to arrays of vertical transistors, to arrays of memory cells comprising an array of vertical transistors, and to methods used in forming an array of vertical transistors

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines, gatelines, or gate lines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Capacitors and transistors may of course be used in integrated circuitry other than memory circuitry.

BRIEF DESCRIPTION OF THE DRAWINGS

FIGS. 4-24 are diagrammatic sequential sectional, expanded, enlarged, and/or partial views of the construction of FIGS. 1-3, or portions thereof, or alternate embodiments, in process in accordance with some embodiments of the invention.

DETAILED DESCRIPTION OF EXAMPLE EMBODIMENTS

Embodiments of the invention include methods used in forming an array of vertical transistors, for example methods used in forming an array of memory cells individually comprising a vertical transistor and a storage device above the vertical transistor. Embodiments of the invention include arrays of vertical transistors including arrays of memory cells comprising vertical transistors independent of method of manufacture. Example method embodiments of forming an array of memory cells including vertical transistors are described with reference to FIGS. 1-22.

Figure 2:
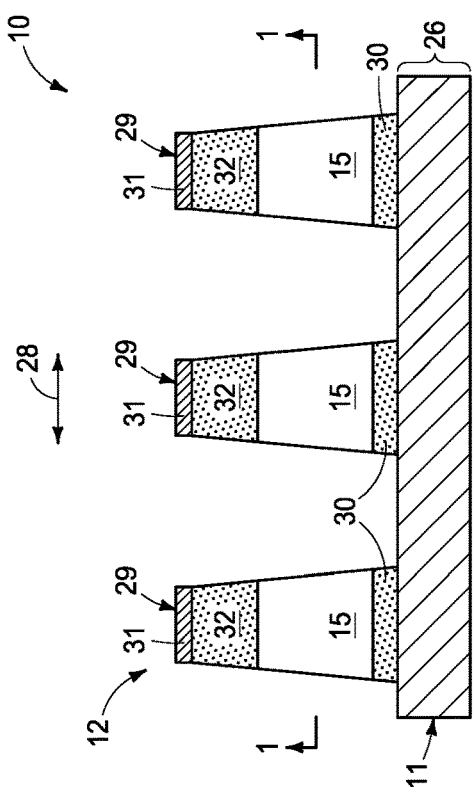
FIG. 2 is a diagrammatic cross-sectional view taken through line 2-2 in FIG. 1.
Figure 3:
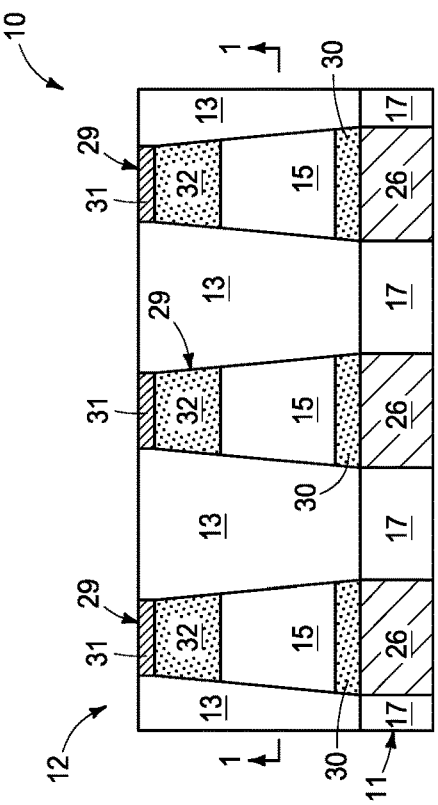
FIG. 3 is a diagrammatic cross-sectional view taken through line 3-3 in FIG. 1.
Figure 1:
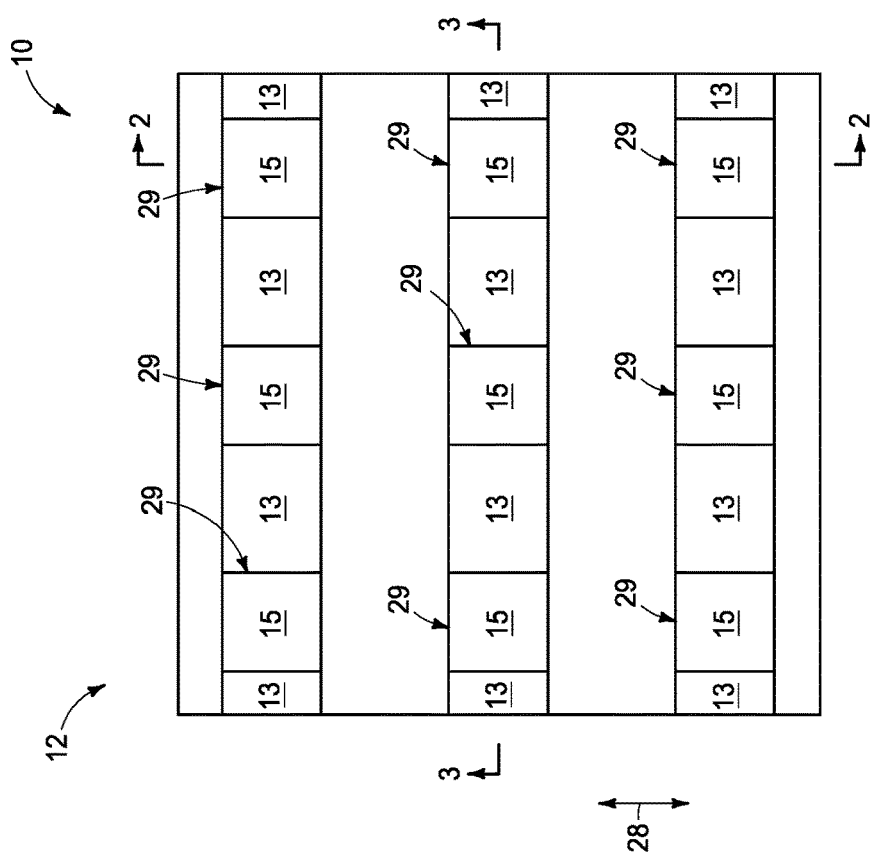
FIG. 1 is a diagrammatic cross-sectional view of a portion of a substrate in process in accordance with an embodiment of the invention and is taken through line 1-1 in FIGS. 2 and 3.

Referring to FIGS. 1-3, such show a portion of a substrate construction 10 comprising a base substrate 11 comprising any one or more of conductive/conductor/conducting, semi-conductive/semiconductor/semiconducting, and insulative/insulator/insulating (i.e., electrically herein) materials. Various materials may be formed elevationally over and within base substrate 11. Materials may be aside, elevationally inward, or elevationally outward of the FIGS. 1-3—depicted materials. For example, other partially or wholly fabricated components of integrated circuitry may be provided somewhere above, about, or within base substrate 11. With respect to memory circuitry, control and/or other peripheral circuitry for operating components within an array of memory cells may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Example base substrate 11 is shown as comprising horizontally-elongated and spaced conductive digitlines 26 that individually interconnect a respective multiple of vertical transistors (not yet shown) of an array 12 of such transistors in a direction 28 (e.g., a column direction). Insulating material 17 (e.g., silicon nitride and/or silicon dioxide) is between digitlines 26. Laterally-spaced vertical projections 29 have been formed that project upwardly from substrate 11 in a vertical cross-section (e.g., that of FIG. 2 and/or FIG. 3). Vertical projections 29 may comprise any of various suitable horizontal cross-sectional shapes, with in one ideal embodiment and as shown vertical projections 29 being laterally and transversely-spaced pillars 29 in a horizontal cross-section (e.g., that of FIG. 1). Insulating material 13 (e.g., silicon dioxide and/or silicon nitride) is between and among pillars 29. Vertical projections/pillars 29 individually comprise an upper source/drain region 32, a lower source/drain region 30, and a channel region 15 vertically there-between. Digitlines 26 and lower source/drain regions 30 may comprises the same material (e.g., conductively-doped semiconductor material or metal material) or may comprise different composition material (e.g., conductively-doped semiconductor material for the lower source/drain regions and metal material for the digitlines). In one embodiment, metal material 31 (e.g., a metal silicide) covers a top of upper source/drain region 32.

Referring to FIGS. 4-6, first gate insulator material 33 has been formed aside pillars 29 and as a minimum along opposing sidewalls 35 (at least some) of channel region 15 in the vertical cross-section. Any suitable overall insulative composition may be used for first gate insulator material 33. A material 34 has been formed over opposing sidewalls of first gate insulator material 33 in the vertical cross-section. In one embodiment, material 34 is conductive and remains to form conductive gate lines as described below. In another embodiment, material 34 is sacrificial to form sacrificial placeholder gate lines as described below. If material 34 is to remain in the finished construction, such ideally comprises metal material. Alternately if such material 34 is sacrificial material, it ideally is of any composition (including metal material) that can be etched selectively relative to first gate insulator material 33 and metal material 31.

Figure 8:
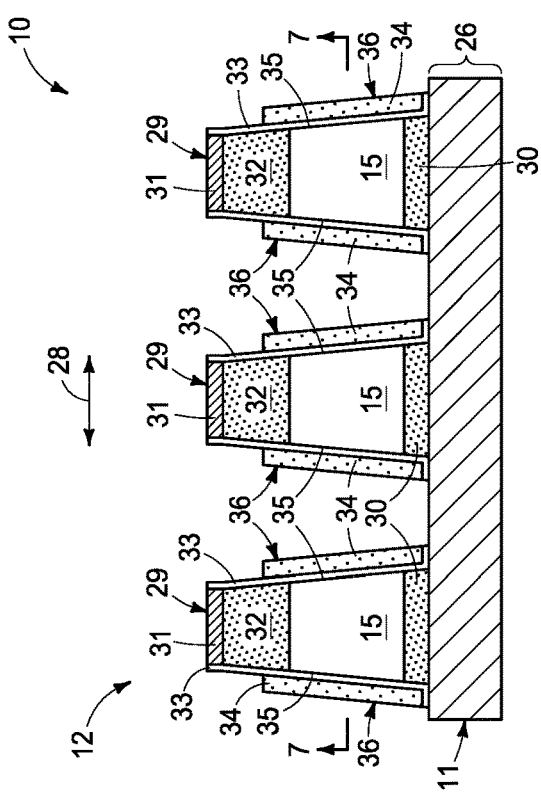
Figure 9:
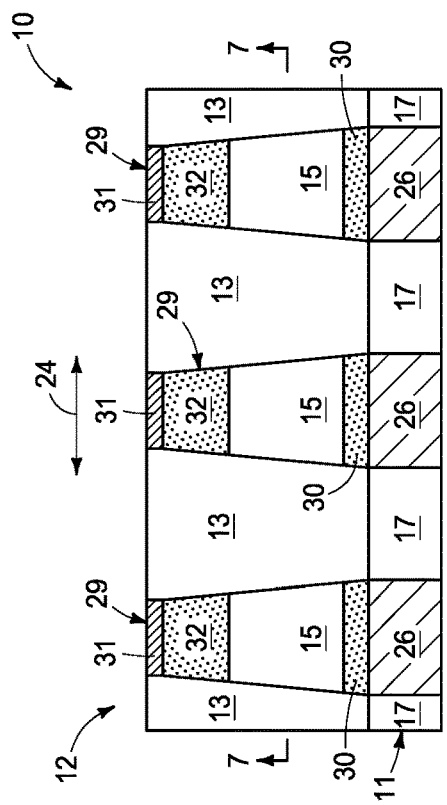
Figure 7:
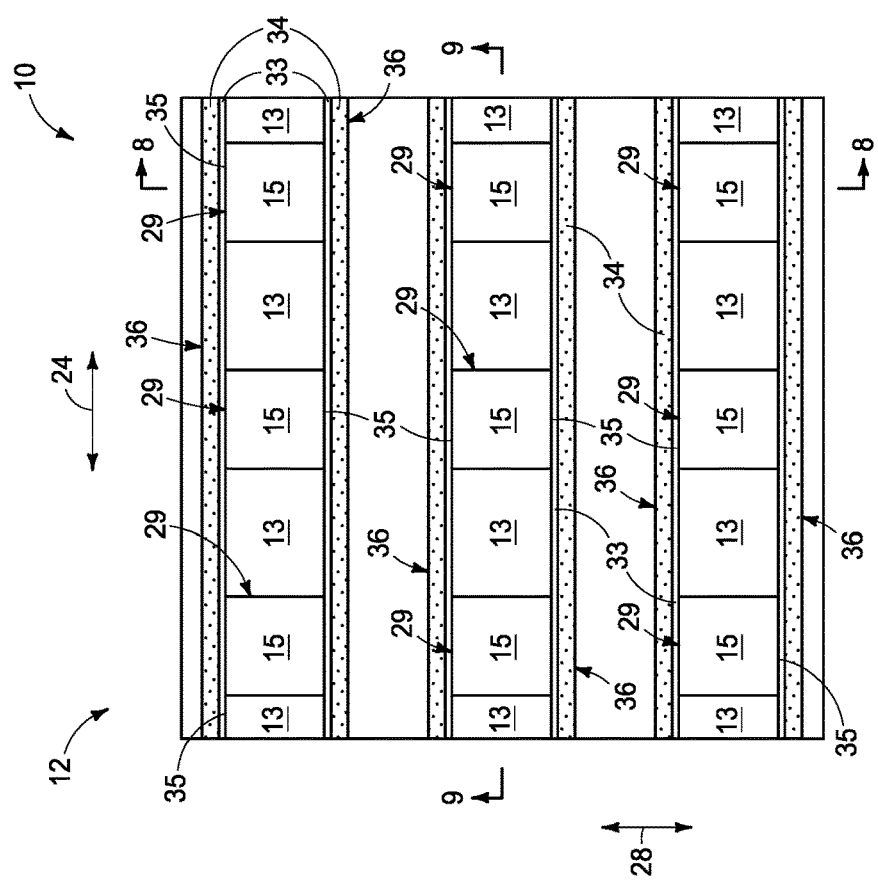

Referring to FIGS. 7-9, material 34 has been etched to form lines 36 thereof that are horizontally elongated through the vertical cross-section (e.g., that of FIG. 8 and along a direction 24 in FIG. 7). In one embodiment, first gate insulator material 33 has also been etched to substantially remove it from being over horizontal surfaces. FIGS. 10 and 11, and in one embodiment, show subsequent isotropic etching of first gate insulator material 33 from being over opposing sidewalls 43 of upper source/drain region 32 and opposing sidewalls 44 of lower source/drain region 30.

Lines 36 comprise one of (a) or (b) over opposing sidewalls of first gate insulator material 33 in the vertical cross-section, where, (a): conductive gate lines that are horizontally elongated through the vertical cross-section, and (b): sacrificial placeholder gate lines that are horizontally elongated through the vertical cross-section. Regardless, conductive/placeholder lines 36 laterally overlap upper source/drain region 32 and lower source/drain region 30. In one embodiment as shown, lines 36 laterally overlap less-than-all of vertical thickness of upper source/drain region 32 and less-than-all of vertical thickness of lower source/drain region 30. Regardless, and in one embodiment, first gate insulator material 33 has a top 37 that is below a top 38 of channel region 15 and has a bottom 39 that is above a bottom 40 of channel region 15. Further, and in one embodiment, an upper void space 41 has been formed that is laterally between the one of conductive gate line 36 or sacrificial placeholder gate line 36 and both of upper source/drain region 32 and channel region 15. Further, and in one embodiment, a lower void space 42 has been formed that is laterally between the one of conductive gate lines 36 or sacrificial placeholder gate lines 36 and both of lower source/drain region 30 and channel region 15.

Figure 13:
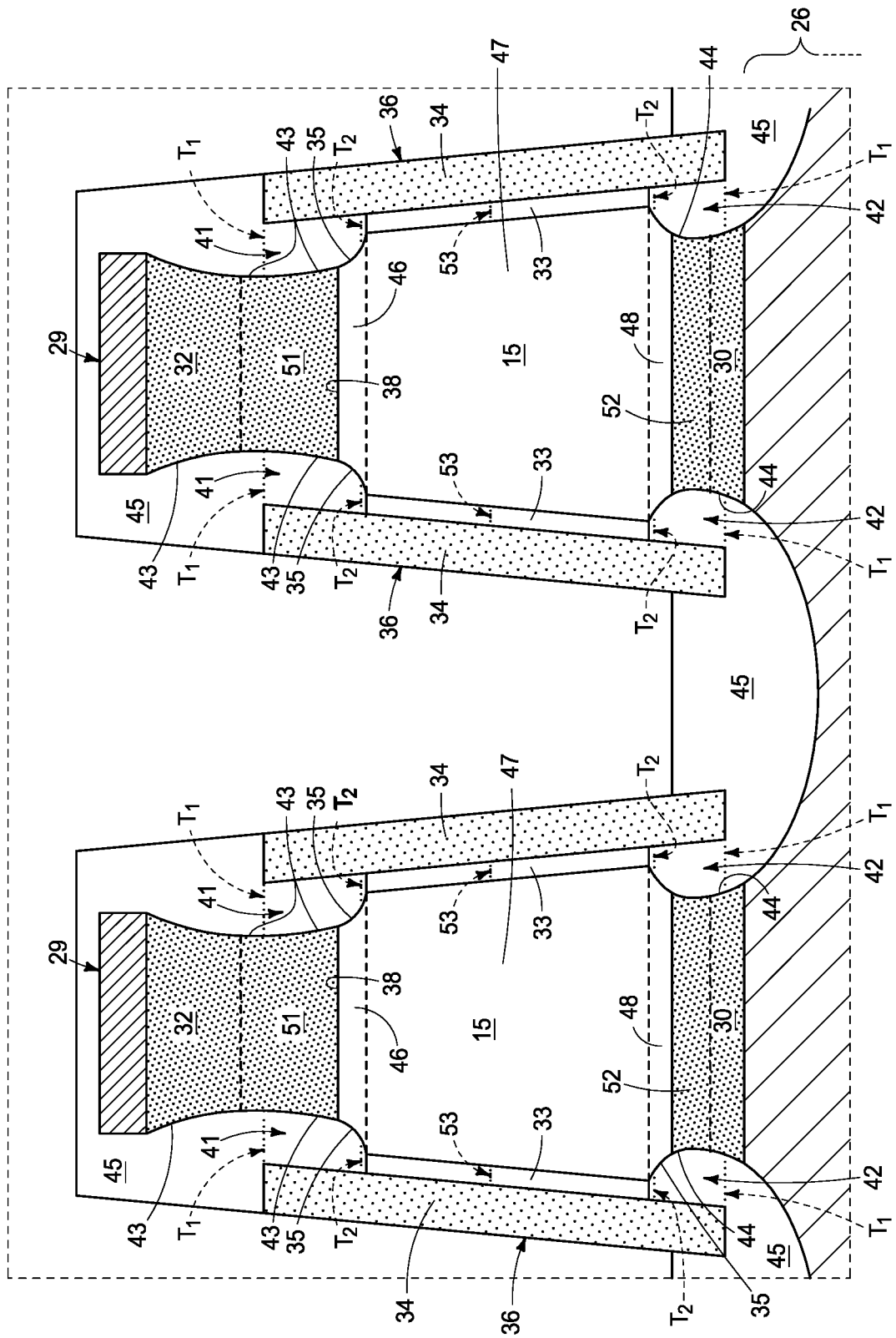
Figure 20:
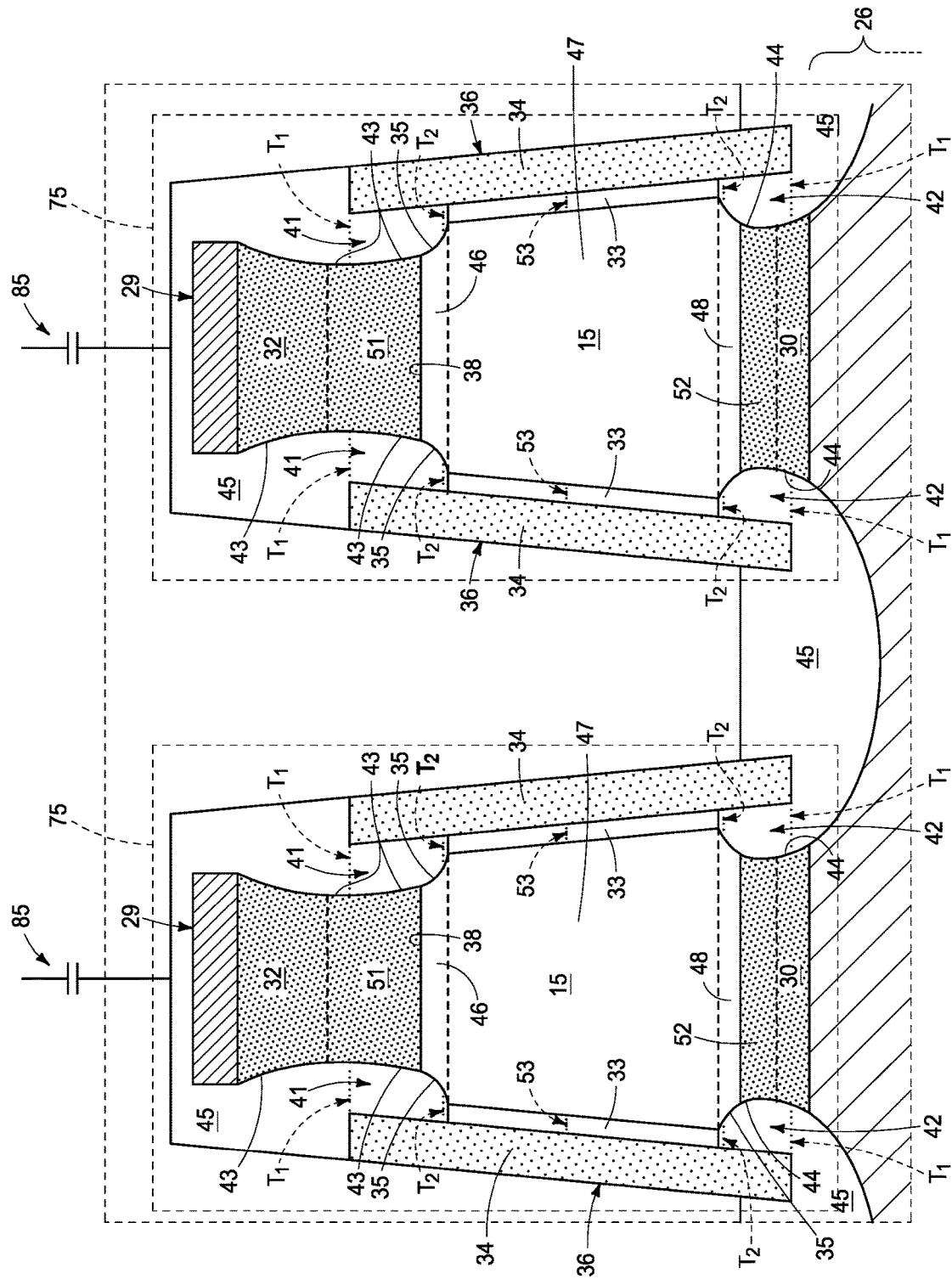

Referring to FIGS. 12 and 13, second gate insulator material 45 has been formed in upper void space 41 and in lower void space 42. Second gate insulator 45 and first gate insulator 33 may be of different compositions relative one another or may be of the same composition relative one another. In one embodiment where of different compositions, second gate insulator material 45 has lower intrinsic k (dielectric constant that is material-intrinsic) than first gate insulator material 33, for example towards minimizing gate-induced-drain-leakage (GIDL). In one embodiment where the first and second gate insulator materials are of the same composition, such are collectively homogenous. Regardless, in one embodiment and as shown, second gate insulator material 45 is formed along all of opposing sidewalls 43 of upper source/drain region 32 and of opposing sidewalls 44 of lower source/drain region 30. In one embodiment and as shown, some of second gate insulator material 45 has been formed from (e.g., into) digitlines 26.

Second gate insulator material 45 may be formed by any suitable manner, for example by oxidizing material of vertical projections/pillars 29 (e.g., by growing an oxide therefrom), or by chemical vapor deposition or atomic layer deposition. FIGS. 12 and 13 show an example wherein second gate insulator material 45 is formed by oxidizing. For example, channel region 15 may be considered as comprising an uppermost portion 46, a lowest portion 48, and an intervening portion 47 vertically there-between. Upper source/drain region 32 may be considered as comprising a lowest portion 51 and lower source/drain region 30 may be considered as comprising an uppermost portion 52. One or both of the lowest portion and uppermost portion may encompass all of thickness of the respective upper source/drain region and lower source/drain region. FIGS. 12 and 13 show oxidizing uppermost portion 46 and lowest portion 48 of opposing sidewalls 35 of channel region 15 in the vertical cross-section (e.g., that of FIGS. 12 and 13). Further, FIGS. 12 and 13 show oxidizing lowest portion 51 of opposing sidewalls 43 of upper source/drain region 32 and uppermost portion 52 of sidewalls 44 of lower source/drain region 30 in the vertical cross-section.

Any suitable method of oxidizing may be used, for example exposure to $O_2$, $O_3$, and/or in situ steam generation wherein a silicon dioxide material is formed/grown where regions 32, 15, and 30 comprise silicon. Regardless, and in one embodiment, second gate insulator 45 has a lateral thickness over each of lowest portion 51 of upper source/drain region 32 (e.g., in upper void space 41 between line 36 and the sidewall of the upper source/drain region 32) and uppermost portion 52 of lower source/drain region 30 (e.g., in lower void space 42 between line 36 and the sidewall of the lower source/drain region 30) that is greater than a lateral thickness 53 of first gate insulator material 33 over intervening portion 47 of channel region 15. Specifically, as shown and in but one example, second gate insulator material 45 is shown as comprising respective maximum lateral thicknesses $T_1$ and minimum lateral thicknesses $T_2$, each of which is greater than lateral thickness 53 of first gate insulator 33. FIGS. 12 and 13 show an example embodiment wherein the lateral thicknesses of second gate insulator material 45 are variable and lateral thickness 53 is constant. Regardless, in one embodiment, the greater lateral thickness is the minimum lateral thickness (e.g., $T_2$), in another embodiment is the maximum lateral thickness (e.g., $T_1$), and in one embodiment is the average lateral thickness with respect to the lateral thicknesses of second gate insulator 45 between conductive/placeholder lines 36 and each of channel-region portions 46, 52 and source/drain regions 32, 30.

Any other attribute(s) or aspect(s) as shown and/or described herein with respect to other embodiments may be used in the embodiments shown and described with reference to the above embodiments.

FIGS. 14 and 15 show an alternate embodiment construction 10*a*. Like numerals from the above-described embodiments have been used where appropriate, with some construction differences being indicated with the suffix "a" or with different numerals. Construction 10*a* shows second gate insulator material 45*a* as having the same lateral thicknesses between conductive/placeholder lines 36 and each of channel-region portions 46, 52 and source/drain regions 32, 30 as lateral thickness 53 of first gate insulator material 33. Such may occur, for example, by atomic layer deposition and/or chemical vapor deposition without appreciable oxidation of material of pillars 29. Any other attribute(s) or aspect(s) as shown and/or described herein with respect to other embodiments may be used.

Referring to FIG. 16, such shows processing subsequent to FIG. 12 wherein material 34 (not shown) that was of sacrificial placeholder gate lines 36 (not shown) has been removed (e.g., by isotropic etching). FIGS. 17-20 show subsequent processing wherein conductive gate material 54 has been substituted therefore, followed by formation of more insulating material 13 to fill remaining void space. Alternately, as stated above, material 34 as initially deposited could be conductive gate material 34/54 wherein no etching and substitution is used. Regardless, material 34/54 could be at least partially covered with an oxidation-resistant liner (e.g., silicon nitride, carbon, and/or SiOC, and not shown) before forming second gate insulator material 45/45*a* towards minimizing oxidation of material 34/54. Regardless, example vertical transistors 75 have been formed thereby.

Any other attribute(s) or aspect(s) as shown and/or described herein with respect to other embodiments may be used.

Figure 22:
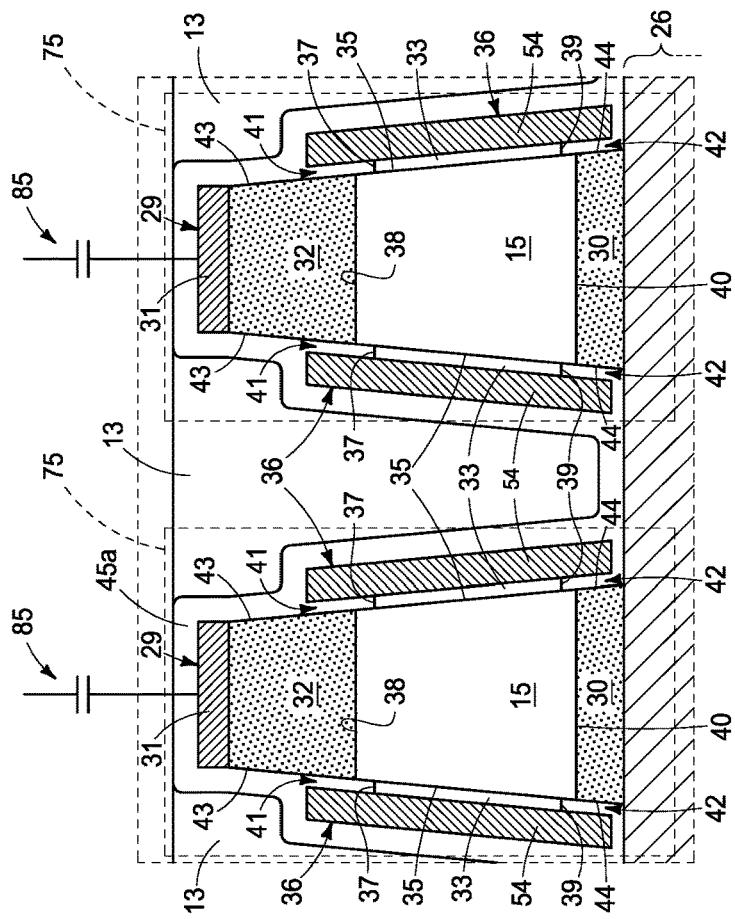
Figure 21:
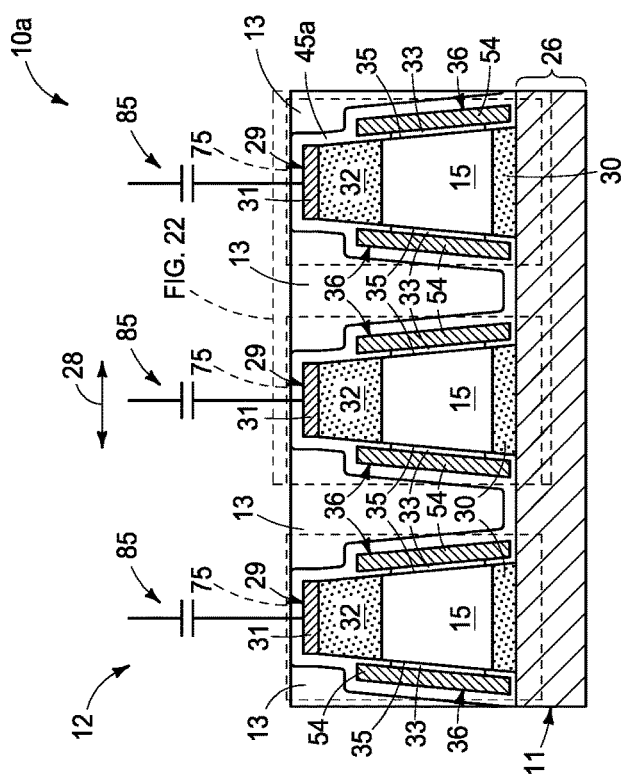

FIGS. 21 and 22 show subsequent analogous processing with respect to construction 10*a*. Second gate insulator material 45*a* may be removed from covering lines 36 (not shown) prior to forming more insulating material 13 regardless of whether material 34 as initially deposited is conductive and/or sacrificial.

The above described and shown array 12 of vertical transistors 75 and method of forming such may encompassed within an array of memory cells. Such memory cells may essentially be entirely encompassed by an individual vertical transistor (e.g., for example wherein first gate insulator material 33 and/or second gate insulator material 45 is programmable, for example being ferroelectric) or comprise other structure. For example, and in one embodiment as shown with respect to FIGS. 17-19, gate lines 36 may be considered as individually interconnecting a respective plurality of vertical transistors 75 in a row direction 24. Digitlines 36 may be considered as individually interconnecting a respective multiple of vertical transistors 75 in a column direction 28. Storage devices (e.g., capacitors 85 as shown) are formed individually above and electrically coupled to (in one embodiment directly electrically coupled to) one of upper source/drain regions 32.

Figure 24:
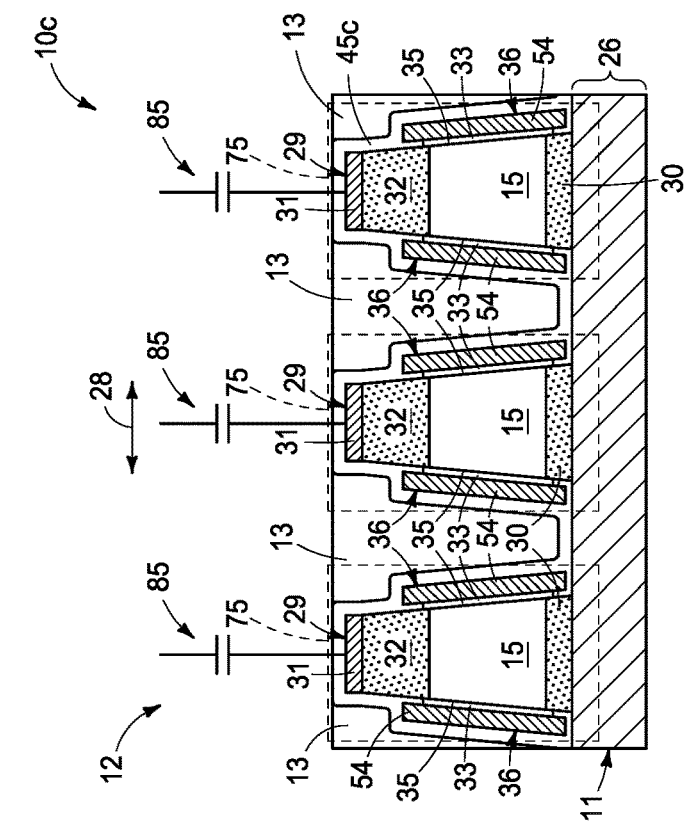
Figure 23:
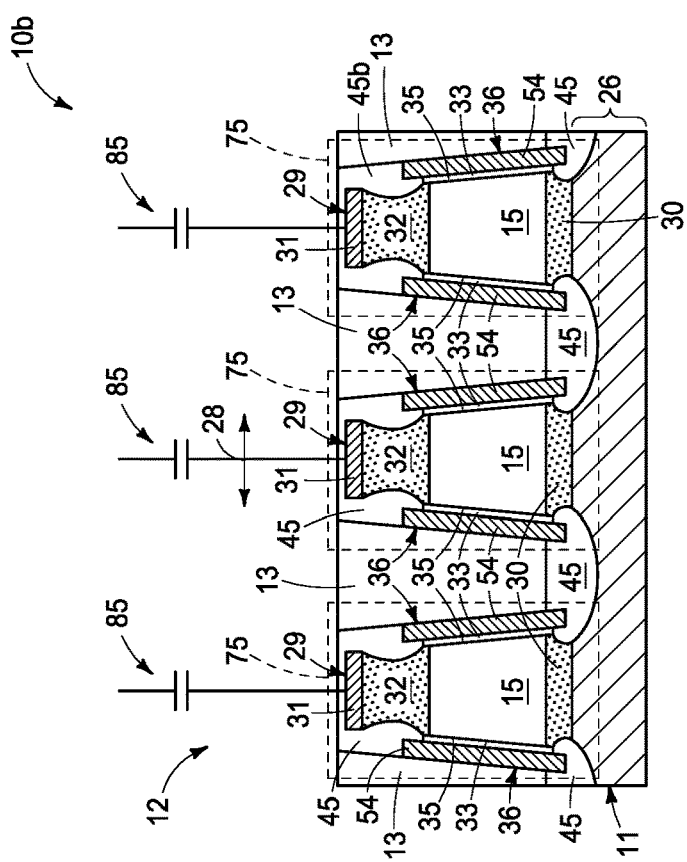

FIG. 23 shows an example alternate embodiment construction 10*b* in closest comparison to that of construction 10 of FIG. 18 and FIG. 24 shows an example alternate embodiment construction 10*c* in closest comparison to that of construction 10*a* of FIG. 22. Like numerals from the above-described embodiments have been used where appropriate, with some construction differences being indicated with the suffix "b" or the suffix "c", respectively. First gate insulator material 33 in each of constructions 10*b* and 10*c* has a top and bottom that is above and below, respectively, the top and the bottom, respectively, of channel region 15. Second gate insulator materials 45*b* and 45*c* have a slightly different constructions thereby. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, an array (e.g., 12) of vertical transistors (e.g., 75) comprises pillars (e.g., 29) of individual vertical transistors (e.g., 75). The pillars individually comprise an upper source/drain region (e.g., 32), a lower source/drain region (e.g., 30), and a channel region (e.g., 15) vertically there-between. The channel region comprises an uppermost portion (e.g., 46), a lowest portion (e.g., 48), and an intervening portion (e.g., 47) vertically there-between. The upper source/drain region comprises a lowest portion (e.g., 51) and the lower source/drain region comprises an uppermost portion (e.g., 52). Gate insulator (e.g., 33/45) is along opposing sidewalls (e.g., 35) of the channel region, of the upper source/drain (e.g., 43), and of the lower source/drain region (e.g., 44) in a vertical cross-section (e.g., that of FIG. 18).

Horizontally-elongated conductive gate lines (e.g., 36) are laterally over the gate insulator material along the opposing sidewalls of the channel region, of the lowest portion of the upper source/drain region, and of the uppermost portion of the lower source/drain region of individual of the pillars.

The gate insulator material has a lateral thickness over and above the opposing sidewalls of the lowest portion of the upper source/drain region that is greater than a lateral thickness of the gate insulator material over the intervening portion of the channel region. Further, the gate insulator material has a lateral thickness over and below the opposing sidewalls of the uppermost portion of the lower source/drain region that is greater than the lateral thickness of the gate insulator material over the intervening portion of the channel region. The gate insulator material may be homogenous or not homogenous. Regardless, in one embodiment, the lateral thickness of the gate insulator material over each of the uppermost portion of the channel region and of the lowest portion of the channel region is greater than the lateral thickness of the gate insulator material over the intervening portion of the channel region. Further, the lateral thickness of the gate insulator material over each of the lowest portion of the upper source/drain region and the uppermost portion of the lower source/drain region is greater than the lateral thickness of the gate insulator material over the intervening portion of the channel region.

Any other attribute(s) or aspect(s) as shown and/or described herein with respect to other embodiments may be used.

In one embodiment, an array (e.g., 12) of vertical transistors (e.g., 75) comprises pillars (e.g., 29) of individual vertical transistors (e.g., 75). The pillars individually comprise an upper source/drain region (e.g., 32), a lower source/drain region (e.g., 30), and a channel region (e.g., 15) vertically there-between. The channel region comprises an uppermost portion (e.g., 46), a lowest portion (e.g., 48), and an intervening portion (e.g., 47) vertically there-between. The upper source/drain region comprises a lowest portion (e.g., 51) and the lower source/drain region comprises an uppermost portion (e.g., 52). Gate insulator (e.g., 33/45) is along opposing sidewalls (e.g., 35) of the channel region, of the upper source/drain (e.g., 43), and of the lower source/drain region (e.g., 44) in a vertical cross-section (e.g., that of FIG. 18).

Horizontally-elongated conductive gate lines (e.g., 36) are laterally over the gate insulator material along the opposing sidewalls of the channel region, of the lowest portion of the upper source/drain region, and of the uppermost portion of the lower source/drain region of individual of the pillars. The gate insulator material comprises a first insulating material (e.g., 33) and a second insulating material (e.g., 45, 45a). The first and second insulating materials comprise different compositions relative one another, with the second insulating material having lower intrinsic k than the first insulating material. The first insulating material is laterally over the intervening portion of the channel region. The second insulating material is laterally over and above the opposing sidewalls of the lowest portion of the upper source/drain region. The second insulating material is laterally over and below the opposing sidewalls of the uppermost portion of the lower source/drain region. In one embodiment, the first insulating material is laterally over each of the lowest portion of the upper source/drain region and the uppermost portion of the lower source/drain region. Any other attribute(s) or aspect(s) as shown and/or described herein with respect to other embodiments may be used.

Providing differing relative permittivity in a gate insulator of a vertical transistor closer to the source/drain regions in combination with at least some gate overlap thereof may improve $I_{on}/I_{off}$ performance and be used to reduce GIDL. For example, using one or more of differing thickness and/or differing composition in a gate insulator closer to the source/drain regions to there-achieve effective lower dielectric constant k may reduce GIDL and reduce parasitic capacitance.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector.

In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials and/or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming an array of vertical transistors comprises forming laterally-spaced vertical projections that project upwardly from a substrate in a vertical cross-section. The vertical projections individually comprise an upper source/drain region, a lower source/drain region, and a channel region vertically there-between. First gate insulator material is formed along opposing sidewalls of the channel region in the vertical cross-section. One of (a) or (b) is formed over opposing sidewalls of the first gate insulator material in the vertical cross-section, where (a): conductive gate lines that are horizontally elongated through the vertical cross-section; and (b): sacrificial placeholder gate lines that are horizontally elongated through the vertical cross-section. The one of the (a) or the (b) laterally overlaps the upper source/drain region and the lower source/drain region. An upper void space is laterally between the one of the (a) or the (b) and the upper source/drain region. A lower void space is laterally between the one of the (a) or the (b) and the lower source/drain region. Second gate insulator material is formed in the upper and lower void spaces.

In some embodiments, an array of vertical transistors comprises pillars of individual vertical transistors. The pillars individually comprise an upper source/drain region, a lower source/drain region, and a channel region vertically there-between. The channel region comprises an uppermost portion, a lowest portion, and an intervening portion vertically there-between. The upper source/drain region comprises a lowest portion and the lower source/drain region comprises an uppermost portion. Gate insulator material is along opposing sidewalls of the channel region, of the upper source/drain region, and of the lower source/drain region in a vertical cross-section. Horizontally-elongated conductive gate lines are laterally over the gate insulator material along the opposing sidewalls of the channel region, of the lowest portion of the upper source/drain region, and of the uppermost portion of the lower source/drain region of individual of the pillars. The gate insulator material has a lateral thickness over and above the opposing sidewalls of the lowest portion of the upper source/drain region that is greater than a lateral thickness of the gate insulator material over the intervening portion of the channel region. The gate insulator material has a lateral thickness over and below the opposing sidewalls of the uppermost portion of the lower source/drain region that is greater than the lateral thickness of the gate insulator material over the intervening portion of the channel region.

In some embodiments, an array of vertical transistors comprises pillars of individual vertical transistors. The pillars individually comprise an upper source/drain region, a lower source/drain region, and a channel region vertically there-between. The channel region comprises an uppermost portion, a lowest portion, and an intervening portion vertically there-between. The upper source/drain region comprises a lowest portion and the lower source/drain region comprises an uppermost portion. Gate insulator material is along opposing sidewalls of the channel region, of the upper source/drain region, and of the lower source/drain region in a vertical cross-section. Horizontally-elongated conductive gate lines are laterally over the gate insulator material along the opposing sidewalls of the channel region, of the lowest portion of the upper source/drain region, and of the uppermost portion of the lower source/drain region of individual of the pillars. The gate insulator material comprises a first insulating material and a second insulating material. The first and second insulating materials comprise different compositions relative one another. The second insulating material has lower intrinsic k than the first insulating material. The first insulating material is laterally over the intervening portion of the channel region. The second insulating material is laterally over and above the opposing sidewalls of the lowest portion of the upper source/drain region. The second insulating material is laterally over and below the opposing sidewalls of the uppermost portion of the lower source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A vertical transistor comprising:
an upper source/drain region, a channel region, and a lower source/drain region; the channel region comprising an upper portion, an intervening portion, and a lower portion;
insulative material along a sidewall of the channel region, a sidewall of the upper source/drain region, and a sidewall of the lower source/drain region;
conductive material adjacent the insulative material, the conductive material vertically extending from a level corresponding to an upper portion of the lower source/drain region to a level corresponding to a lower portion of the upper source/drain region; and the insulative material being thicker at both the level corresponding to the upper portion of the lower source/drain region and the level corresponding to the lower portion of the upper source/drain region than at a level corresponding to the intervening portion of the channel region.

2. The vertical transistor of claim 1 wherein the sidewall of the upper source/drain region comprises a concave portion.

3. The vertical transistor of claim 2 comprising another sidewall of the upper source/drain region that comprises a concave portion.

4. The vertical transistor of claim 1 wherein the sidewall of the lower source/drain region comprises a concave portion.

5. The vertical transistor of claim 4 comprising another sidewall of the upper source/drain region that comprises a concave portion.

6. The vertical transistor of claim 1 wherein,
the sidewall of the upper source/drain region comprises a concave portion; and
the sidewall of the lower source/drain region comprises a concave portion.

7. The vertical transistor of claim 6 comprising:
another sidewall of the upper source/drain region that comprises a concave portion; and
another sidewall of the upper source/drain region that comprises a concave portion.

8. The vertical transistor of claim 1 wherein the upper portion sidewall of the channel region comprises a concave portion.

9. The vertical transistor of claim 8 comprising another upper portion sidewall of the channel region that comprises a concave portion.

10. The vertical transistor of claim 1 wherein the lower portion sidewall of the channel region comprises a concave portion.

11. The vertical transistor of claim 10 comprising another lower portion sidewall of the channel region that comprises a concave portion.

12. The vertical transistor of claim 1 wherein,
the upper portion sidewall of the channel region comprises a concave portion; and
the lower portion sidewall of the channel region comprises a concave portion.

13. The vertical transistor of claim 1 wherein the insulative material is homogenous.

14. The vertical transistor of claim 1 wherein the insulative material is not homogenous.

15. The vertical transistor of claim 1 wherein the conductive material is adjacent less-than-all of vertical thickness of the upper source/drain region and is adjacent less-than-all of vertical thickness of the lower source/drain region.

16. The vertical transistor of claim 1 wherein the conductive material is adjacent all of the sidewall of the upper source/drain region and all of the sidewall of the lower source/drain region.

17. A vertical transistor comprising:
an upper source/drain region, a channel region, and a lower source/drain region; the channel region comprising an upper portion, an intervening portion, and a lower portion;
insulative material along a sidewall of the channel region, a sidewall of the upper source/drain region, and a sidewall of the lower source/drain region;
conductive material adjacent the insulative material, the conductive material vertically extending from a level corresponding to an upper portion of the lower source/drain region to a level corresponding to a lower portion of the upper source/drain region;
the insulative material being thicker at both the level corresponding to the upper portion of the lower source/drain region and the level corresponding to the lower portion of the upper source/drain region than at a level corresponding to the intervening portion of the channel region;
the sidewall of the upper source/drain region comprises a concave portion;
the sidewall of the lower source/drain region comprises a concave portion;
the upper portion sidewall of the channel region comprises a concave portion; and
the lower portion sidewall of the channel region comprises a concave portion.

18. The vertical transistor of claim 17 wherein the insulative material is homogenous.

19. The vertical transistor of claim 17 wherein the insulative material is not homogenous.

20. The vertical transistor of claim 17 wherein the conductive material is adjacent less-than-all of vertical thickness of the upper source/drain region and is adjacent less-than-all of vertical thickness of the lower source/drain region.

21. The vertical transistor of claim 17 wherein the conductive material is adjacent all of the sidewall of the upper source/drain region and all of the sidewall of the lower source/drain region.

22. A vertical transistor comprising:
an upper source/drain region, a channel region, and a lower source/drain region; the channel region comprising an upper portion, an intervening portion, and a lower portion;
insulative material along a sidewall of the channel region, a sidewall of the upper source/drain region, and a sidewall of the lower source/drain region;
conductive material adjacent the insulative material, the conductive material vertically extending from a level corresponding to an upper portion of the lower source/drain region to a level corresponding to a lower portion of the upper source/drain region;
the insulative material comprising a first insulating material and a second insulating material, the first and second insulating materials comprising different compositions relative one another, the second insulating material having lower intrinsic k than the first insulating material; and
the first insulating material being laterally over the intervening portion of the channel region, the second insulating material being laterally over and above the opposing sidewalls of the lowest portion of the upper source/drain region, the second insulating material being laterally over and below the opposing sidewalls of the upper portion of the lower source/drain region.

23. The vertical transistor of claim 22 wherein the first insulating material is laterally over each of the lowest portion of the upper source/drain region and the upper portion of the lower source/drain region.

24. The vertical transistor of claim 22 wherein the conductive material laterally overlap less-than-all of vertical thickness of the upper source/drain region and less-than-all of vertical thickness of the lower source/drain region.

25. The vertical transistor of claim 22 wherein the second insulating material is along all of the sidewall of the upper source/drain region and of the lower source/drain region.

26. The vertical transistor of claim 22 wherein the second insulating material has a lateral thickness over each of the lowest portion of the upper source/drain region and of the upper portion of the lower source/drain region that is equal to a lateral thickness of the first insulating material over the intervening portion of the channel region.

27. The vertical transistor of claim 22 wherein the second insulating material has a lateral thickness over each of the lowest portion of the upper source/drain region and of the upper portion of the lower source/drain region that is greater than a lateral thickness of the first insulating material over the intervening portion of the channel region.

\* \* \* \* \*